United States Patent [19]
White et al.

[11] Patent Number: 5,350,926
[45] Date of Patent: Sep. 27, 1994

[54] COMPACT HIGH CURRENT BROAD BEAM ION IMPLANTER

[75] Inventors: Nicholas R. White, Wenham, Mass.; Manny Sieradzki, Gloucester; Anthony Renau, West Newbury, all of Mass.

[73] Assignee: Diamond Semiconductor Group, Inc., Gloucester, Mass.

[21] Appl. No.: 29,766

[22] Filed: Mar. 11, 1993

[51] Int. Cl.$^5$ ............................................. H01J 37/317
[52] U.S. Cl. ................................ 250/492.21; 250/398; 250/251
[58] Field of Search ................. 250/492.21, 492.3, 398, 250/397, 396 ML, 396 R, 251

[56] References Cited

U.S. PATENT DOCUMENTS

| | | | |
|---|---|---|---|
| 3,845,312 | 10/1974 | Allison, Jr. | 250/398 |
| 4,017,403 | 4/1977 | Freeman | 250/492 |
| 4,486,664 | 12/1984 | Wollnik | 250/396 |
| 4,661,712 | 4/1987 | Mobley | 250/492.2 |
| 4,745,281 | 5/1988 | Enge | 250/356 |
| 4,812,663 | 3/1989 | Douglas-Hamilton et al. | 250/492.2 |
| 4,914,305 | 4/1990 | Benveniste et al. | 250/492.3 |
| 5,091,655 | 2/1992 | Dykstra et al. | 250/492.2 |
| 5,126,575 | 6/1992 | White | 250/492.3 |
| 5,177,361 | 1/1993 | Krahl et al. | 250/396 ML |
| 5,206,516 | 4/1993 | Keller et al. | 250/492.2 |

OTHER PUBLICATIONS

Instability Threshold for a Calutron (Isotope Separator) With Only One Isotope Species, Igor Alexeff, IEEE Transactions on Plasma Science, vol. P3-11, No. 3, Jun. 1983.

The Design of Magnets with Nondipole Field Components, White et al., Nuclear Instruments and Methods in Physics Research A258 (1987) 437-442 North-Holland, Amsterdam.

*Primary Examiner*—Jack I. Berman
*Attorney, Agent, or Firm*—Lahive & Cockfield

[57] ABSTRACT

A compact high current broad beam ion implanter capable of serial processing employs a high current density source, an analyzing magnet to direct a desired species through a resolving slit, and a second magnet to deflect the resultant beam while rendering it parallel and uniform along its width dimension. Both magnets have relatively large pole gaps, wide input and output faces, and deflect through a small radius of curvature to produce a beam free of instabilities. Multipole elements incorporated within at least one magnet allow higher order aberrations to be selectively varied to locally adjust beam current density and achieve the high degree of uniformity along the beam width dimension.

23 Claims, 3 Drawing Sheets ial production line implantation of ions into large workpieces such as semiconductor wafers.

COMPACT HIGH CURRENT BROAD BEAM ION IMPLANTER

BACKGROUND OF THE INVENTION

The present invention relates to ion implantation systems, and more specifically to the design of high current implanters for serial production line implantation of ions into large workpieces such as semiconductor wafers.

The doping of semiconductors with electrically active elements is now performed almost exclusively with ion implanters. Several recent trends in semiconductor technologies suggest characteristics that would be desirable in the design of ion implanters. These trends include the following:

For workpieces which are silicon wafers, the standard wafer size has increased over the years until 200 mm is the standard diameter used in new facilities today, and manufacturers are planning for 300 mm and larger.

For workpieces which are flat panel displays, dimensions today exceed 300 mm, and larger sizes are to be expected.

As the density of memory elements in DRAMs increases, the implanted energy requirements at high doses are decreasing. High doses of boron at energies between 2 and 10 keV will be required of future process tools.

Processes require the ability to control the angle of incidence of the ion beam on the semiconductor substrates. Variation across the wafer can cause process failures.

High current ion implanters may be broadly defined as the class of instruments in which the ion beam current is great enough that it must be space-charge neutralized to be transported through the ion implanter. This property generally holds true for currents in excess of 1 mA. To meet the usual range of practical applications, high current implanters are typically specified to deliver up to between 15 and 30 mA of n-type dopant ions, and up to between 6 and 12 mA of boron ions. All high current implanters commercially available in 1991 implant batches of wafers, and achieve uniformity of doping by scanning, placing the wafers on a spinning disk, wheel, or drum, to provide one scanning direction, and either moving the wafer carrier normal to the beam, or electromagnetically scanning the beam to achieve another scanning direction.

Batch processing systems of this type suffer from reduced throughput when the batch size is mismatched to the size of the production lot, making it very expensive to test a process, since a complete batch must be processed every time. Rotating disk assemblies must be cone-shaped if centrifugal force is used to retain the wafers, causing variations in implant angle and such variations in the orientation of the implant angle cannot be avoided in spinning disk batch systems. The size of a spinning disk assembly suitable for 300 mm or larger substrates would be prohibitive, as would be the intrinsic value of a single lot. Systems which process each workpiece individually are known as serial systems, and these are to be preferred when the technology permits.

However, because of the difficulty in making a high current beam of high uniformity, commercial machines have relied largely, if not exclusively, on batch processing machines having large motive assemblies to achieve uniformity by spatial averaging.

Accordingly, it would be desirable to develop an ion beam apparatus of high current that is useful for commercial implanting tasks, yet covers a large area uniformly in a serial manner.

SUMMARY OF THE INVENTION

This is achieved in accordance with one aspect of the present invention by providing a high current ion beam which is analyzed and expanded to a ribbon shape having both a high degree of parallelism and uniformity of intensity, and scanning a single workpiece stage across the beam with a linear or quasi-linear motion. The ribbon beam has a width substantially over 150 millimeters, and preferably over 200 or 300 millimeters. While operating at high current, the power density of the expanded beam is kept down by operating at energies well below 100 kV, and preferably in the range of about 12 kV. A first magnetic lens is designed to achieve a uniform degree of magnification along a single dimension which is the width dimension of the beam, parallel to a slot-shaped ion extraction aperture, from which the beam expands in two directions. The analyzing lens deflects the beam so it passes cleanly through a resolving aperture. A second magnet with larger pole width deflects the divergent beam leaving the resolving aperture and renders it parallel in both directions.

Preferably both the first and second magnetic lenses each deflect the beam through an arc of between approximately 70° and 90°, in the same sense, so that the expanded, analyzed and parallel beam is turned back toward the source direction, resulting in a compact implantation assembly. At least the analyzing magnet preferably has concave input and output faces with a slot transverse to the beam path, and has a wide gap. In at least one of the lenses, aberrations are corrected to achieve a substantially uniform magnification, or beam expansion factor, along the width dimension of the beam. Preferably a plurality of movable rods or pole pieces extend vertically within the slot and are adjusted by steppers in response to beam profile measurements to introduce controlled amounts of aberration, tuned to reduce hot spots. The pole gap is greater than one quarter the radius of curvature of the ion beam trajectory. An analyzing slot is placed between the first and second magnets, and these are preferably wired in series, so that the instantaneous current is identical. The initial ion source is an ionization chamber with a slot in a convex surface through which ions are extracted in a beam which diverges radially away from the center of curvature of the slot.

BRIEF DESCRIPTION OF THE DRAWINGS

These and other features of the invention will be understood by a person skilled in the art from the description to follow, and illustrative drawings, wherein.

DETAILED DESCRIPTION

Figure 1:
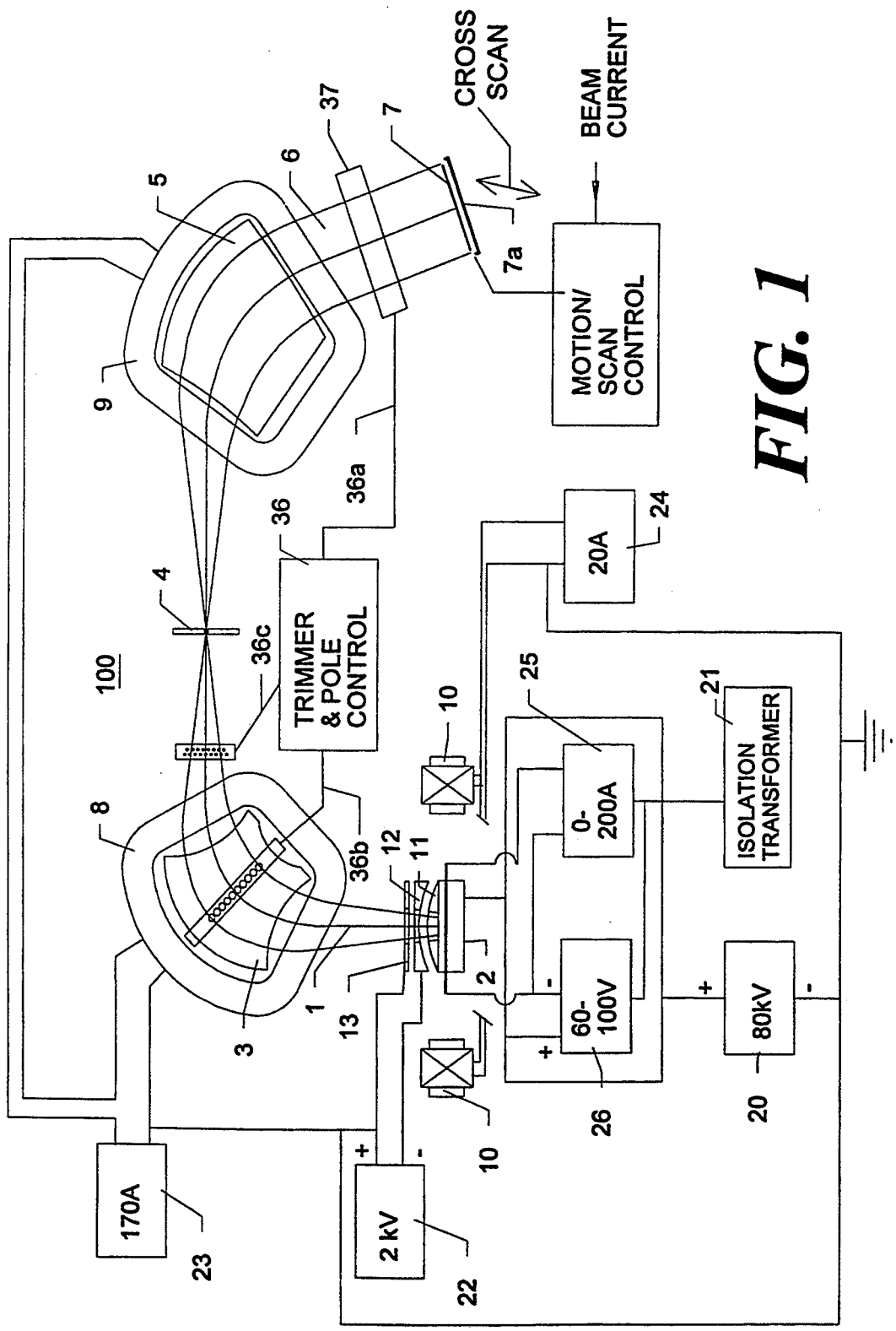
FIG. 1 is a drawing, partly schematic, of an ion beam apparatus in accordance with the present invention.

An ion beam implanter in accordance with the present invention achieves a wide ribbon beam of high uniformity at current above a milliampere and energy above several keV by utilizing a special slot-shaped source of high uniformity, an analyzing magnet of shape and aspect to expand the beam with highly controlled aberrations in a single plane, and a second magnet that further deflects and renders the beam parallel. Unique properties of the system will be better understood from the following considerations.

Applicant has realized that an ion beam system accelerating milliampere beams to energies of a few keV that is analyzed and deflected with dipole magnets is subject to instabilities closely related in nature to those which have been reported to affect Calutrons used in isotope separation. A theoretical model of such instabilities has been presented by Igor Alexeff in IEEE Transactions on Plasma Science, Vol. PS-11, Jun. 2, 1983. These instabilities cause pronounced noisy oscillation in beam transmission at frequencies generally of several hundred kilohertz, and cause beam growth and loss of control of uniformity. Applicant has undertaken to design an ion implanter minimizing the effect of such instabilities, in accordance with the present invention, as described below, and applicant is thus able to achieve commercially useful beams of a ribbon shape and extreme uniformity, so that simple linear or quasi-linear scanning will uniformly implant large workpieces in a serial system.

In general, the uniformity of an ion beam varies along its length, and is extremely difficult to control. In accordance with the present invention, applicant controls and preserves the uniformity of a large ribbon-shaped beam in a single transverse direction. In general it would be substantially more difficult to control the uniformity of an ion or electron beam in both transverse dimensions simultaneously, as described by Allison, and the requirement of parallelism would make the problem still more difficult, so that prior systems have had to rely greatly on special combinations of beam construction and mechanical scanning/transport mechanisms in order to achieve an acceptable level of uniformity over a region large enough to be commercially useful.

In this regard, it is understood that even if a beam is substantially uniform as it leaves an ion source, it generally does not remain so because the ions within the beam are travelling in a variety of directions. Aberrations in optical elements tend to generate caustics within the beam, which are observable as bright lines, as is familiar to practitioners in the field. Applicant addresses this difficulty by expanding the extracted ion beam to reduce the spread of angles within it, and by careful design of the beam optical elements controls aberrations in one plane of interest at the expense of those aberrations which do not affect one dimensional uniformity. Multipole aberrations are reduced close to zero and their exact values are then controlled by steppers to obtain fine control of the spatial variation of current density of the ion beam at a specified location, specifically, to control the uniformity of a strip beam.

An ion implanter constructed in accordance with this invention comprises an ion source, such as a Freeman, Bernas, or Microwave source, from which the ion beam is extracted from a plasma maintained within the source through a parallel-sided convex slot. The plasma is made substantially uniform along the length of the slot by methods known to those skilled in the art, for example, by ensuring a high degree of uniformity in the ion source magnetic field. A ribbon-shaped beam extracted through the slot expands in both dimensions; significantly, as illustrated further below, its larger dimension diverges radially away from the center of curvature of the convex slot through which it is extracted.

An analyzing magnet then focuses the beam in both dimensions, deflects it, and is arranged so that the beam passes cleanly through a resolving aperture. Unwanted components in the beam fail to be transmitted and are rejected. A second magnet of similar dimensions but larger pole width accepts the divergent beam leaving the resolving aperture, and deflects and renders it parallel in both dimensions.

The design of systems employing such deflection magnets to control the focusing properties and the second-order aberrations is preferably performed using the well known and readily available computer program TRANSPORT, described by K. L. Brown in publications of the Stanford Linear Accelerator Center (SLAC). In general, using this program it can be arranged that there is a 1 to 1 mapping between the location at the ion source from which an ion leaves the plasma, and its position in the beam at the plane of the workpiece. However, in designing the magnetic elements for the ion beam of the present invention, Applicant specifies that this 1 to 1 mapping condition hold approximately in a single dimension, which is the horizontal direction in the preferred embodiment described below. Under these conditions, then, the uniformity of the beam at the workpiece reflects the uniformity of the plasma in this one dimension. The TRANSPORT program yields an output beam with variations held to less than 4% without taking the active means described below to further reduce it.

In accordance with a preferred embodiment of the invention, this level of beam uniformity is improved and tailored to achieve 1% variation across the workpiece by providing a controller responsive to beam profile measurements for adjusting sextupole and higher multipole components, which may be included in the design of the analyzing magnets, or may be provided by using separate discrete adjustable electromagnetic multipole lenses.

The current density, $J_i$, at the implant position is in general a function of the horizontal transverse coordinate $x_i$, where the suffix i denotes the implant location. The following analysis discusses horizontal variations in current density, with the vertical current profile integrated through the height of the beam. The term magnification, which should strictly only be discussed for an imaging system, is used, even though the system discussed is not necessarily an imaging system, since the concept of magnification is useful to convey the argument. This is $$J_i = J_s/M$$

where the s suffix denotes the ion source location, and M is the magnification; beam attenuation effects are ignored in this analysis. The magnification is, by definition $$M = dx_i/dx_s$$

The magnification may itself be a function of x. It is well known (as described, for example, in publications by K. L. Brown) that the optical properties of such an ion optical system may conveniently be represented to second order, and in principal to any order, by a transfer matrix formalism, and this is used in the computer code TRANSPORT, which allows determination of the coefficients determining $x_i$ in the transfer relation:

$$x_1 = a_{11}x_s + a_{12}x_s' + \ldots$$
$$+ a_{111}x_s^2 + a_{112}x_s x_s' + a_{112}x_s'^2 + \ldots$$

The effect of angle, $x'$, is zero for an imaging system, but in general may be considered for greater accuracy. Neglecting $x'$, $$M = a_{11} + 2a_{111}x_s$$

Thus the magnification can vary with the x coordinate, depending on the second and higher order transfer coefficients. The beam current density is inversely proportional to the magnification, and therefore is controllable by means of the second and higher order transfer coefficients. The transfer coefficients can be theoretically controlled by means of discrete sextupole and other multipole lenses, or by an arrangement similar to that described in the literature by Wollnik; although in a high current ion implanter these might occupy excessive space and involve considerable complexity and cost.

In the preferred embodiment of applicants' invention means are provided for adjustment of these higher order terms by incorporating sextupole or higher order magnet elements directly into the specially shaped dipole bending magnets. Fixed sextupole components have been used for many years, as described by White, Purser and Kowalski in *Nuclear Instruments and Methods in Physics Research* A 258 (1987) 437–442. One means of adjusting the sextupole component of field is to incorporate shaped coils into the magnet pole faces. Another, which has the advantage of being independent of the excitation current, is to provide a plurality of physically adjustably positioned steel pole shims.

As described further below, the present invention achieves a large uniform beam of commercial utility by a design process that consciously sets about maximizing transmitted current at low energies. The sense in which the current is "maximized" will be understood from the following.

Transporting high currents of ion beams at low energies requires the space-charge of the beam, which otherwise tends to disrupt and expand the beam, to be neutralized through trapping electrons within the beam. A space-charge neutralized beam consists of a form of plasma, and based on this recognition, applicant has determined that the beam blowup which limits existing commercial ion implanter beam currents at energies below about 30 keV is usually due to beam plasma instabilities, and not, as sometimes believed, to space-charge neutralization loss. This form of beam blowup occurs when a sharply defined current density limit is exceeded in the beam as it passes through the magnetic field of the analyzer magnet. Measurements establish that the beam blowup occurs even in beams which are space-charge neutralized. This beam blowup consists of disruption of the trajectories of the ions at frequencies between about 100 kHz and several MHz.

A family of these beam plasma instabilities have been explored by I. Alexeff in connection with the separation of isotopes in Calutrons, and applicant White together with Grey Morgan have further presented data demonstrating that these instabilities can occur in ion implanter beams (findings presented at the IEEE Plasma Conference, Williamsburg, Jun. 4, 1991). The instabilities can occur when the ion plasma frequency exceeds the ion cyclotron frequency. These two quantities are defined as follows:

$$\text{Ion plasma frequency } \omega_{pi} = q\sqrt{\frac{\eta_0}{\epsilon_0}} \quad M = \sqrt{\frac{Jq}{\epsilon_0\sqrt{2M_q V}}}$$

$$\text{Ion cyclotron frequency } \omega_{ci} = qB/M = 1/R\sqrt{2qV/M}$$

where q is the charge on the ion, $\eta_0$ is the volume density of ions, $\epsilon_0$ is the permittivity of free space, M is the mass of the ions, J is the ion current density, V the potential through which the ions have been accelerated, B the magnetic field, and R the radius of the trajectory of the ions in the magnetic field. Experimentally, applicant has found that the plasma frequency must exceed the cyclotron frequency by a factor between 1.4 and 2 before serious beam blowup occurs.

It can be shown from the above description that the requirement to avoid plasma instability induced beam blowup is:

$$J < 2\ V^{3/2}\ \epsilon_0 (2q/m)^{1/2}\ /\ R^2$$

In order to produce a commercially useful output level while avoiding instabilities that lead to beam blowup, applicant has taken an approach to system design which can be summarized as follows:

Minimize the bending radius of the magnets,
Maximize the cross-sectional area of the beam in the magnets,
Keep the ion beam current density as uniform as possible, and
Maintain a high pumping speed from the center of the analyzing magnets.

A physical solution in accordance with the present invention includes an ion beam system in which the magnet pole gap is greater than 0.25 of the radius of curvature of the ion trajectories. The pole width is approximately equal to the bending radius. These two features in combination maximize the beam transport capabilities as far as possible, yet permit excellent control of the parallelism of the final beam.

With the foregoing considerations in mind, a detailed description of the illustrated embodiments of the invention will now be given.

In FIG. 1, an implanter system 100 operates with an ion beam 1 produced by ion source 2. Various ion sources 2 may be used, including Freeman, Bernas, or microwave ion sources, a Freeman source being illustrated. Ion beam 1 is ribbon-shaped, being initially between 50 and 75 mm wide but only 2 to 5 mm high as it exits a curved slot in ion source 2.

Figure 2A:
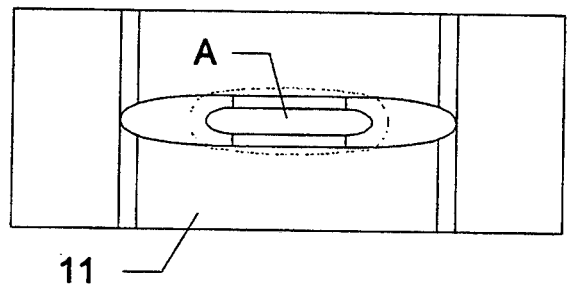
FIGS. 2A–2C are views of extraction grids in the ion source of the apparatus of FIG. 1.

The source provides a spatially uniform distribution of ions across a slot shaped aperture, indicated generally by "A" in FIG. 2A, and as illustrated includes a power source 25 for passing current through a hot filament (not numbered) and a magnet 10 energized by magnet power supply 24 to constrain the emitted electrons so that ion species in the source chamber are efficiently and uniformly ionized. An arrangement of three slotted grids 11, 12, 13 serve to confine, extract and accelerate ions from the source.

Figure 2B:
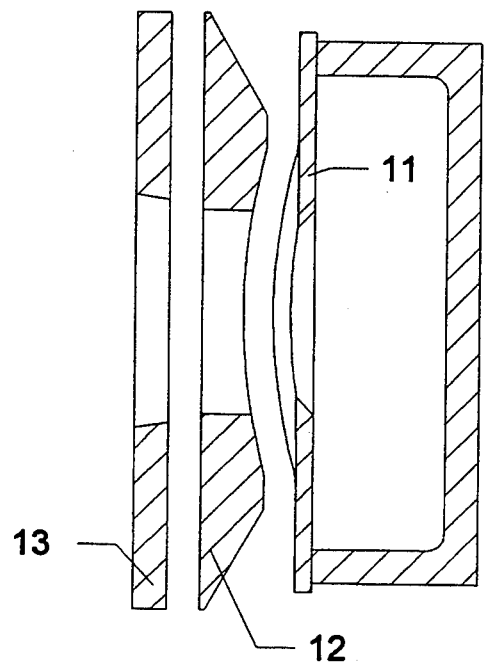
Figure 2C:
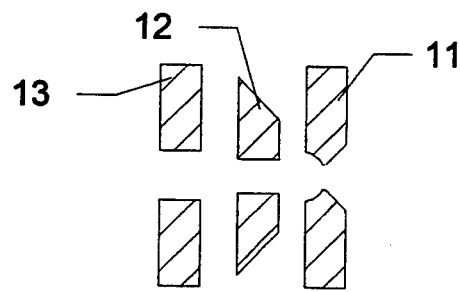

As shown in greater detail in FIGS. 2A–2C, in the preferred source, the extraction grid 11 is bowed convexly outward, and has a slot with its top and bottom edges parallel, narrowing at the very ends of the slot. The front and rear surfaces are beveled so that the slot edges are knife-edged, as seen in the vertical sectional view, FIG. 2B. The slot 11 from which ion beam 1 is extracted from the plasma in ion source 2 is curved such that the ions in the beam are initially accelerated normal to the surface along trajectories that diverge from a point center of curvature located approximately 150 mm behind the ion source grid 11, and diverge at an angle greater than +/−5 degrees in the horizontal plane. The slot has horizontal parallel curved sides, and a height of between 2 and 5 mm. The second grid 12 is formed of thick graphite or metal stock and has a rear source-facing surface which is parallel to the contour of grid 11, so that emitted ions are accelerated radially outward, i.e., normal to the surface contour of grid 11. Grid 12 has a flat front face, the slot aperture of grid 12 being slightly larger than that of grid 11 so that the second grid is not eroded by emitted ions. A front grid 13, which is energized by a high voltage extraction source 20, is a flat plate, parallel to the front face of grid 12, and having a slot in registry with that of grid 12. A suppression power supply 22 is connected between grids 12 and 13 to maintain the intermediate grid at a higher potential difference with respect to the ion source 2, so that the energy of the extracted beam is decreased in passing from grid 12 to grid 13, and the beam is slightly collimated. Representative values are indicated for an 80 keV system, although it will be understood that in practice the system may be adjusted to deliver ions of any energy below 80 keV, and in that case the suppression source is adjusted accordingly, for example to a voltage level that minimizes grid intercept current.

Continuing now with FIG. 1, the ribbon-shaped ion beam 1 enters between the poles of an analyzing electromagnet 3 whose field is generally oriented in a vertical direction, and the field deflects the ion beam 1 through an angle of approximately 90 degrees, with a mean radius of curvature of 300 mm. This magnet represents a radical departure from those of conventional implanter systems. The shape of the poles of electromagnetic 3 is designed using the computer code TRANSPORT described above to control second-order aberrations as well as providing first-order focusing, and is configured to focus ion beam 1 to a narrow focus allowing it to pass through a resolving slit 4 having a width of about 5 mm. Unwanted ions having differing momentum are deflected through different angles by the magnetic field, so that they are intercepted on either side of the resolving slit. The use of a deflecting magnet and resolving aperature is relatively conventional, except for the magnitude of the angles of divergence and convergence in the ion beam. These require that the correction of second and higher order aberrations be accomplished with accuracy.

Ion beam 1 diverges again after passing through the resolving aperture 4, and passes between the poles of a second electromagnet 5, which deflects it through a further 70 degrees with a mean radius of curvature of 512 mm. The poles of both electromagnets 3 and 5 are designed using TRANSPORT so as to provide an exiting ion beam 6 with the properties that it is uniform in current across its width, parallel to within approximately plus or minus one degree, and free from unwanted ion species and from ions of incorrect energy.

The uniformity of exiting ion beam 10 is controlled within these limits by modifying the second- and higher-order transfer coefficients of electromagnet 3, and to a lesser extent those of electromagnet 5. In the preferred embodiment this is accomplished by moving pieces of specially contoured pole inserts in the central region of both the upper and lower pole pieces of magnet 3, to introduce variation in the sextupole, octupole and higher-order magnetic field components of the magnet, which are referred to herein generally as multipole components. In other embodiments the same corrective effects can be accomplished by means of shaped coils placed in recesses in the magnet poles through which separately controlled currents are passed. More conventional electromagnetic multipole lenses, for example as described by Wollnik, may also achieve some corrections.

In accordance with this aspect of the present invention, a control unit 36 receives beam intensity information along line 36a from a beam profiler 37 and sends control signals along lines 36b to control multipole elements in magnet 3, or along lines 36c to control a beam trimmer, for effecting fine adjustment. The profiler may be operated between processing runs, or intermittently at intervals of weeks or months, to determine corrections which have become necessary due to aging of components and variations in the power supplies. Control unit 36 then adjusts the multipole elements. Dynamic adjustment in this manner achieves a much higher degree of uniformity in the output beam 6 than would be achieved with a fixed design magnet alone.

At the implant position a target 7 is moved up and down at a controlled velocity on a stage 7a. Ion beam 6 does not fluctuate in magnitude over time, so a uniform implant is accomplished by moving target 7 through the output beam 6 with its vertical component of velocity constant (where vertical is understood to mean simply transverse to the wide dimension of the beam and across the beam axis). It is immaterial whether target 7 moves in a straight line or on a curvilinear path, provided that it does not rotate during its passage across the beam 6.

In general, the ion beam 1 is extracted from the ion source 2 at an energy between 2 and 80 keV, depending on the implanting application to be achieved. The total current may have any value up to approximately 60 mA, to ensure that the analyzed beam 6 passing slit 4 contains up to at least 15 mA of the desired ion species. Available species may include $B^+$, $BF_2$, $P^+$, $As^+$, and others.

In accordance with one preferred feature of the present invention, the quantity of unwanted sputtered contamination in the analyzed ion beam 6 is reduced by designing the two electromagnets 3 and 5 so that they are to be operated at the same current as each other, and then connecting them in series. This ensures that all of the ions which pass through the first magnet 3 will also be correctly transmitted through the second magnet 5. In the event of malfunction, high voltage spark, or transient event which temporarily disrupts the correct operation of the system, no ion beam will be transmitted through the resolving aperture 4 which could strike the walls of the vacuum chamber in magnet 5, so no unwanted sputtered material would proceed downstream towards the implanted target 7. This construction eliminates a major source of machine wear or process contamination.

Figure 3:
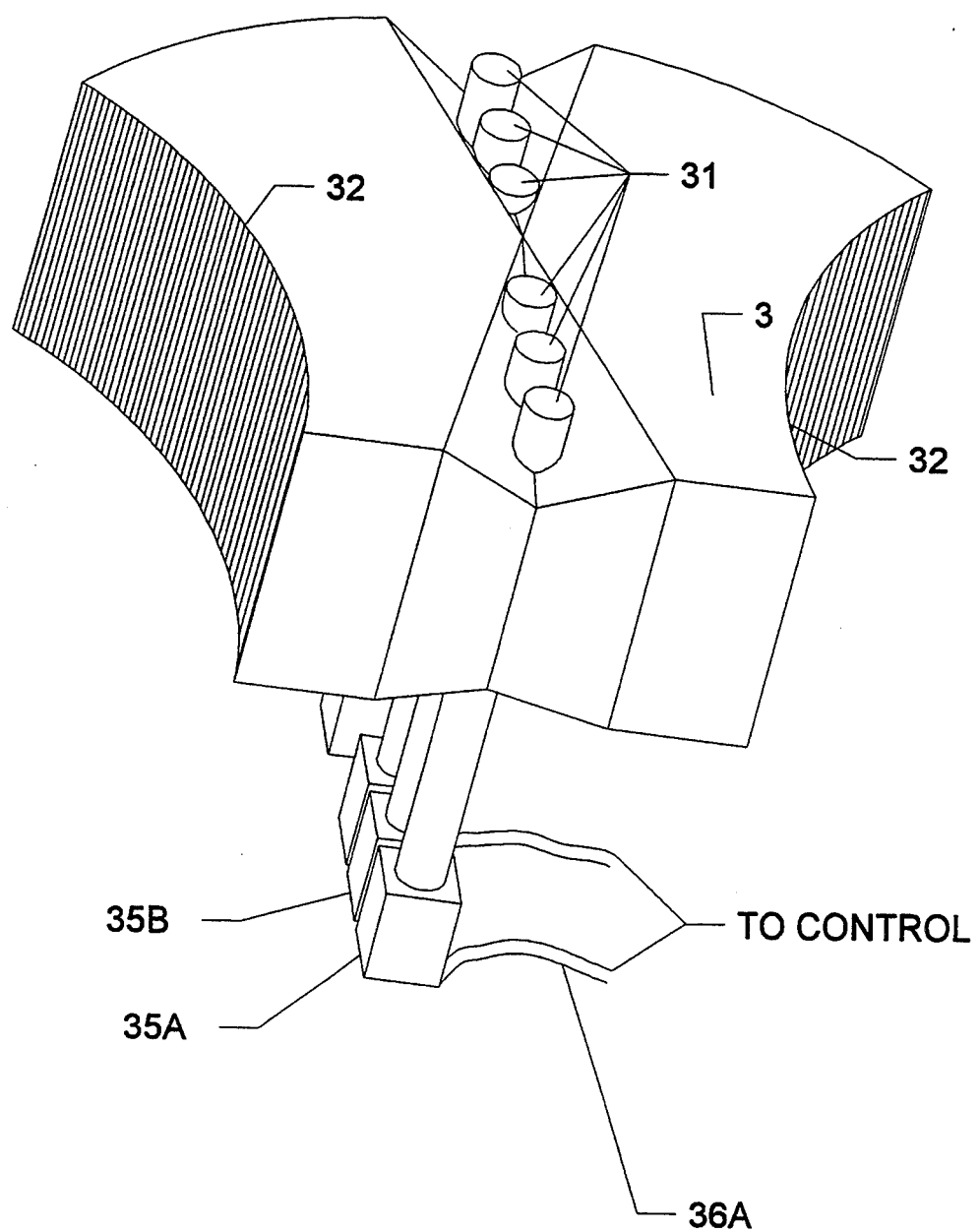
FIG. 3 is a perspective view of one pole piece of the analyzing magnet of the apparatus of FIG. 1.

FIG. 3 shows the presently preferred shape of a specific embodiment of one pole piece of the magnet 3. The inner face, which is the top face as shown, is flat, so the field is nominally uniform, except in a central region where a crosscut or angled notch 30 is situated. In the preferred embodiment, crosscut 30 consists of two cuts transverse to the beam direction. Each cut has an included angle of 90 degrees, i.e., is milled with a 90° cutter to form a sloping valley, with the base of the cut at an angle between about 20 and 25 degrees to the pole surface. Entrance and exit pole edges 32 are symmetrically radiused with a radius of approximately 0.35 meters forming concave input and output faces thereby affecting the shape and area of magnetic gap that is transversed by the beam at different locations across the beam width. The crosscut and the radiused pole edges provide sextupole terms which are calculated to prevent second-order aberrations from reaching a magnitude that would to degrade the mass resolving power of the system. The mass resolving power expressed as $M/\Delta_M$ at full width half maximum exceeds 60. Fine adjustment of the second and higher order transfer coefficients is preferably accomplished by a plurality of iron rods 31, which serve as independently adjustable local pole pieces placed transversely to the beam at the base of the crosscut. At one end of each rod 31, a positioning unit 35a, 35b responds to position control signals for moving the rod up or down to vary the field in the gap. Each rod pole piece may be moved in a vertical direction, to differentially increase or decrease the magnetic field strength at different points along the pole edge, thereby selectively causing slight modifications to the directions of a bundle of nearby beam trajectories.

To further improve the uniformity of ion beam 6, a secondary, non-magnetic, beam adjustment or a beam trimming means, for example, a plurality of overlapping beam scrapers arranged generally transverse to ion beam 1 close to magnet 3 or magnet 5, are preferably also added. Such scrapers may be used to reduce the current locally where a peak in the current density is found to occur for some reason beyond the control of the multipole tuning elements. Final adjustment of the inserts 31 is made after the beam profiler 37n measures beam intensity in an array of points in the output beam to determine the desired level of correction.

With the foregoing arrangement, output beam 6 is rendered parallel and uniform over a beam width well over several hundred millimeters wide and with a power density and energy suitable for implanting ions. The stage 7a at the implant position moves the target across the parallel beam 6 to scan the full area of a wafer or panel. Notably, by employing two magnets that each deflect the beam a quarter turn, the output beam has been turned back toward the source, and a very compact instrument results. For example, for a beam width W of 0.2 to 0.3 meters, the basic source and two dipole magnets and stage all fit within a footprint having a short overall length and an area less than 30 $W^2$. This has a significantly smaller beam line than conventional implanters, as well as a much broader beam. Both magnets are preferably constructed on a single steel base which is part of the magnetic circuit of each magnet, a configuration that further stabilizes alignment of the two magnets.

The invention being thus disclosed, variations and modifications will occur to those skilled in the art. The system may be increased or decreased in scale, the orientation of the beam forming and shaping elements may be vertical instead of horizontal, and various reflections and modifications of the disclosed geometry may be made. The two magnets need not bend in the same direction. A variety of arrangements including conveyor belts may be used to pass the target 7 through the ion beam 6, and means may be included to vary the orientation of the target 7 with respect to the direction of ion beam 6. Different adjustable sextupole means may be used, such as vertically adjustable iron rods placed against the outer edge of the pole piece and transversely arranged with respect to the ion beam. These and all such variations and modifications are intended to be within the scope of the invention, as defined in the claims appended hereto.

What is claimed is:

1. A ion implanter apparatus for implanting a uniform dose of ions into a workpiece, such apparatus comprising:
   an ion source that produces a beam having a shape with transverse length and width dimensions, the beam diverging in both length and width directions and being substantially uniform in current density in at least one transverse dimension,
   an analyzing magnet to refocus said beam through a resolving aperture and reject unwanted components of said beam,
   a second magnet to accept, deflect and shape the beam after transmission through said resolving aperture, into an output beam for implanting a workpiece,
   said analyzing magnet and second magnet together expanding and altering trajectories of the beam produced by the ion source such that the output beam is a ribbon shaped beam of substantially parallel ion trajectories, and is longer than the workpiece in one of said transverse dimensions, substantially smaller in the other of said transverse dimensions, and substantially uniform in current density along said longer dimension.

2. The apparatus of claim 1, further comprising means for moving the workpiece through said output beam at a velocity which is controlled to achieve a selected dose of ions uniformly implanted into said workpiece.

3. The apparatus of claim 1, further comprising a beam profiling means to measure uniformity of said output beam.

4. The apparatus of claim 1, further comprising means for adjusting uniformity of the ion beam, said means for adjusting including at least one multipole focusing element.

5. The apparatus of claim 4, wherein said multipole focusing element is adjusted by a controller responsive to data from a beam profiler.

6. The apparatus of claim 4, wherein a said multipole focusing element is incorporated into at least one of said analyzing and said second magnet.

7. The apparatus of claim 1, further comprising mechanical beam trimmer means for adjusting uniformity of the ion beam.

8. The apparatus of claim 7, wherein said mechanical beam trimmer means is adjusted by a controller responsive to data from a beam profiler.

9. The apparatus of claim 1, further comprising
   means for varying velocity of the workpiece in direct proportion to measured ion beam current, and
   means for varying a constant of proportionality between said current and said velocity, thereby controlling the dose of ions implanted into the workpiece.

10. The apparatus of claim 1, further comprising means for varying an angle at which the workpiece is held thereby varying incidence angle of ions and azimuth with respect to a reference direction on the workpiece.

11. The apparatus of claim 1, wherein the analyzing magnet and the second magnet deflect the beam from the source such that the output beam travels in a direction substantially opposite to the direction in which ions leave the source, ions in the beam following a turning path such that the ion beam apparatus covers an area less than $30W^2$, where W is the width of the ion beam as it impinges on the target.

12. The apparatus of claim 1, wherein said analyzing magnet and said second magnet are constructed on a steel base which is a part of the magnetic circuit of both magnets, thereby stabilizing alignment of the two magnets.

13. The apparatus of claim 1, wherein the analyzing magnet and the second magnet are electromagnets connected in a series.

14. In a method for implanting a target with an ion beam in which ions of a desired species are separated by passing a space-charge neutralized ion beam in vacuum through one or more magnets, and wherein a trajectory of an ion of the desired species at the center of the ion beam moves along a curved path of radius r, and in which the ion beam current is sufficiently high that ion plasma frequency of the ion beam is comparable to ion cyclotron frequency, the steps of:

arranging that a pole gap of a said magnet exceeds r/4, arranging that a pole width of said magnet measured transverse to the beam exceeds r, arranging that the ion beam enters said magnet as a divergent beam such that cross-sectional area of the ion beam in said magnet substantially occupies the entire usable space between magnet poles defined by the pole width and the pole gap and walls of the vacuum chamber thereby maintaining the ion plasma frequency at a level relative to the ion cyclotron frequency effective to prevent beam blow-up, and shaping the magnet poles to reduce second-order aberrations which would otherwise reduce achievable resolving power.

15. In a method of implanting a workpiece with an ion beam, the steps of:

generating an ion beam which diverges in two directions, the ion beam including a desired ion species, and passing it through a first magnet which focuses the desired species through a resolving slit, thereby rejecting unwanted species and forming a beam of said desired species, passing said beam of said desired species through a second magnet whose ion-optical properties form said beam of desired species into an output beam of ribbon shape, with a major transverse dimension larger than a face of the workpiece to be implanted, and with a minor dimension small relative to said workpiece, ions of the output beam being rendered parallel within about one degree, and uniform in current along said major dimension within about 4 percent across the width of the workpiece, mounting the workpiece on a non-rotating scanning mechanism at a selected angle and orientation relative to the direction of said ion beam, and scanning said workpiece through said ion beam one or more times at a velocity in relation to ion beam current, effective to implant a dose of ions into the workpiece which is substantially uniform in angle, orientation and dose per unit area.

16. In the method of claim 15, the additional step of using multipole elements to control uniformity of the ion beam.

17. In the method of claim 16, the step wherein said multipole elements control ion beam current to be uniform within about two percent across the width of the workpiece.

18. In the method of claim 15, the step wherein passing said beam through the first and second magnets renders it uniform in current within about one percent across the width of the workpiece.

19. The apparatus of claim 1, wherein the ion source produces said beam through a convexly curved grid having a slot for extraction of a divergent curtain of ions from the source, and the analyzing magnet comprises upper and lower pole pieces which are opposed for receiving said divergent curtain in a gap therebetween and bending the curtain along a curved path, a bounding surface of the analyzing magnet transverse to said path being generally concave and said pole pieces having a slot of varying width and depth for defining a field that expands and focuses said curtain.

20. The apparatus of claim 19, wherein the slot of a pole piece has a plurality of pole elements moveably mounted therein for selective introduction of higher order magnetic field components.

21. The apparatus of claim 20, further comprising detection means for detecting beam intensity at a plurality of output positions, and control means, responsive to said detection means for varying position of said pole elements to enhance beam uniformity along said one transverse dimension.

22. Ion beam apparatus, comprising
an ion source for forming an input beam
an analyzing aperture
a first magnet for deflecting said beam such that a selected component passes through the analyzing aperture
a second magnet for deflecting the selected component into an output beam,
wherein said first and second magnets are designed to operate at identical current, and are electrically connected in series with each other whereby when a power transient occurs, the beam does not pass the analyzing aperture and downstream sputtering is prevented.

23. Ion beam apparatus according to claim 22, wherein said first and second magnets are mounted on a common base forming at least in part a magnetic circuit of each magnet.

* * * * *